March 1, 1960 GE YAO CHU 2,927,277

UNILATERALIZED TRANSISTOR CIRCUITS

Filed May 22, 1956 2 Sheets-Sheet 1

INVENTOR.
GE YAO CHU
BY Kenway, Jenney, Witter & Hildreth
ATTORNEYS

March 1, 1960 GE YAO CHU 2,927,277

UNILATERALIZED TRANSISTOR CIRCUITS

Filed May 22, 1956 2 Sheets-Sheet 2

INVENTOR.
GE YAO CHU
BY Kenyon & Kenyon
Witter & Hildreth
ATTORNEYS

United States Patent Office 2,927,277

Patented Mar. 1, 1960

2,927,277

UNILATERALIZED TRANSISTOR CIRCUITS

Ge Yao Chu, Ipswich, Mass., assignor, by mesne assignments, to Sylvania Electric Products Inc., Wilmington, Del., a corporation of Delaware Application May 22, 1956, Serial No. 586,493

8 Claims. (Cl. 330—27)

The present invention relates generally to transistor amplifier circuits, and more particularly to circuits having inverse feedback to neutralize the inherent feedback in the transistor.

The characteristics of junction type transistor amplifiers, like those of triode vacuum tubes, vary with the frequency of the applied signal. Observation of the gain, stability (i.e., freedom from tendency to oscillate), selectivity and input impedance as functions of frequency reveals the existence of considerable internal feedback at frequencies appreciably above the audio range, for example, near or above the intermediate frequency of 455 kc. commonly employed for receivers for amplitude-modulated radio transmission. Ideally, an amplifier should be unilateral, that is, non-responsive to variations in the output signal, but the existence of inherent feedback leads to undesired bilateral characteristics. A primary object of this invention is to provide transistor amplifier circuits exhibiting unilateral properties and freedom from the effects of internal feedback.

Other collateral objects are to improve the input impedance characteristic, to render the gain more uniform within the band width of tuning, and to reduce or eliminate the tendency toward oscillation.

With the foregoing and other objects in view, the features of the invention comprise circuit means especially devised to apply external inverse feedback to the transistor amplifier, whereby the transistor becomes substantially non-responsive to its inherent feedback signal. There is thus provided a singly-tuned transistor amplifier of greatly improved characteristics for higher frequency applications. A further desirable result is that it is made possible to devise transistor amplifiers of variable band pass characteristics by the staggered tuning principle.

Other features reside in certain details of the circuits, and in modes of operation thereof which will become evident from the following description and from the appended drawings illustrating the same.

Figure 1:
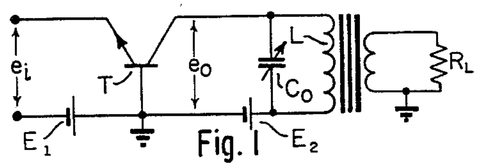
Fig. 1 is a circuit diagram of an emitter-input transistor amplifier of conventional form.

Referring to Fig. 1, there is shown a grounded base transistor amplifier of conventional form and including an n-p-n transistor T of the junction type. An input signal $e_i$ is applied. The collector circuit includes a tuned tank circuit comprising an inductance L and a capacitance $C_o$. $R_L$ represents an equivalent load which receives maximum power at the resonant frequency of the tank circuit. Conventional bias voltages are supplied by batteries $E_1$ and $E_2$.

Figure 11:
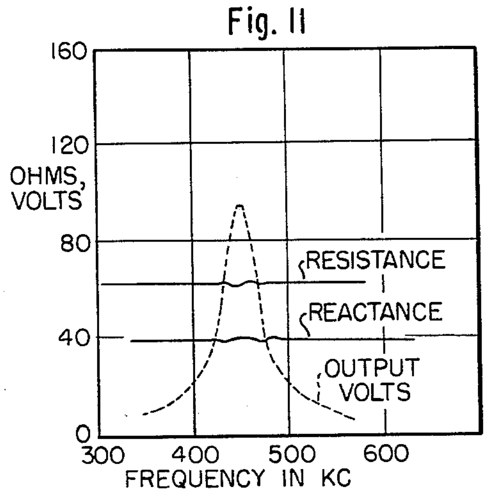
Fig. 11 is a diagram illustrating the characteristics of an intermediate frequency amplifier according to the invention.
Figure 12:
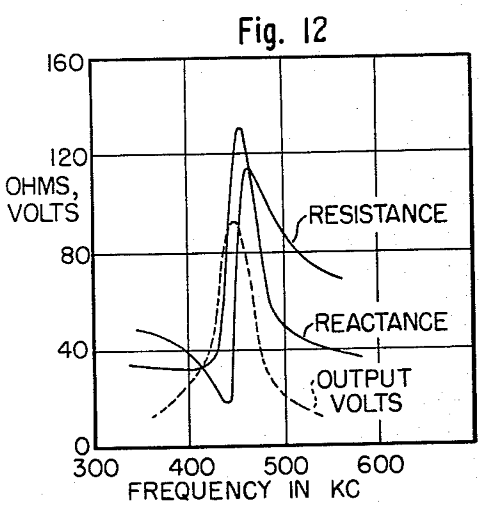
Fig. 12 is a diagram illustrating the characteristics of an amplifier of conventional form as illustrated in Figs. 1 and 7.

Ideally, such a circuit would have the characteristics exhibited in Fig. 11. Here, input resistance and reactance curves for the transistor alone are plotted against frequency ($e_i$ assumed constant in amplitude) and show no appreciable change adjacent or within the pass band, while the output voltage sharply increases in the pass band due to the change in reactance of the tank circuit. However, by observation it is found that the actual input impedance of the amplifier at a frequency of 455 kc. is typically as represented in Fig. 12. The resistance and reactance of the transistor undergo marked change within the pass band, and the illustrated resistance and reactance curves reflect these changes as well as those of the tank circuit itself. These impedance variations within the transistor are not only appreciable at frequencies substantially above the audio range, but also undesirable because they tend to reduce the gain and stability of the amplifier.

Figure 2:
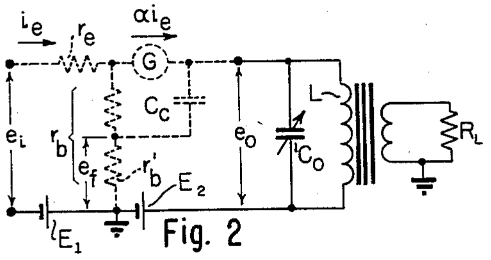
Figs. 2 and 3 are equivalent circuit diagrams illustrating internal feedback in the circuit of Fig. 1 and its correction.

It is useful to describe the observed results in terms of a so-called "equivalent circuit." Within a degree of approximation and within a particular range of frequencies, this circuit may take the form shown in Fig. 2 in broken lines. The emitter circuit responds substantially as if it included an emitter resistance $r_e$ in series with a base resistance $r_b$, the latter including a resistance $r'_b$. In like manner, the collector circuit responds as if it included an active current generator G and a collector capacitance $C_c$ connected from one output terminal to the point of connection of the resistance $r'_b$ with the other resistance making up $r_b$. The generator G is defined as a source of infinite internal impedance which carries a current $\alpha i_e$, where $\alpha$ is the transfer current amplification factor of the transistor. From these assumptions it follows that the output voltage $e_o$ influences the input current $i_e$, and by definition also the current output of the generator G. Since the resistance $r'_b$ is in the input circuit, the feedback voltage $e_f$ is the voltage across this resistor due to the output voltage $e_o$. This voltage has a substantial component in quadrature with the voltage $e_o$ by reason of the capacitance $C_c$. Thus $$e_f = \frac{e_o r'_b}{r'_b + \frac{1}{j\omega C_c}} \tag{1}$$

Figure 3:
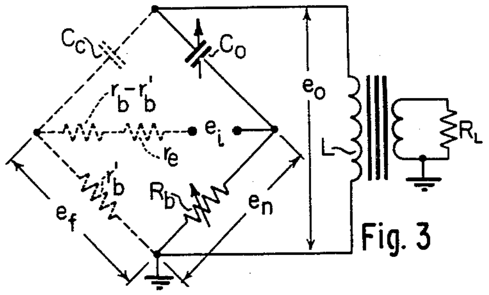

To balance out or neutralize this component there is introduced an external feedback circuit to provide a balanced bridge as shown in Fig. 3. Here, the same equivalent circuit as that of Fig. 2 is shown as connected with external impedances $R_b$ and $C_o$, the external impedances having such values that no voltage appears across the terminals of the input voltage $e_i$ in response to the voltage $e_o$. This condition is satisfied if a neutralizing voltage $e_n$ equals the feedback voltage $e_f$, which leads readily to the expression $$r'_b C_c = R_b C_o \tag{2}$$

This is the condition imposed on the impedances $R_b$ and $C_c$ for a unilateral characteristic. It is seen that this is a function of the observed internal feedback characteristics of the transistor.

Figure 4:
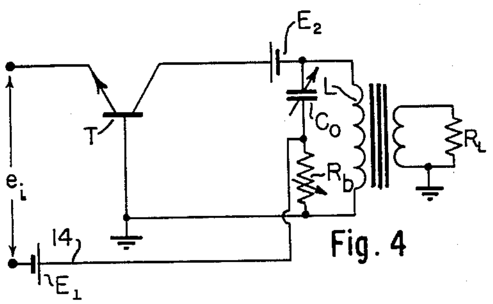
Fig. 4 is a circuit diagram of a first embodiment of the invention based on Fig. 3.

Replacing the equivalent circuit with the conventional symbol for the transistor and rearranging the impedances, we have the circuit of Fig. 4. This circuit is substantially unilateralized to the extent that the actual characteristics of the transistor are fairly represented by the given equivalent circuit of Fig. 2 and the assumed impedance values $r'_b$ and $C_c$ thereof.

Figure 5:
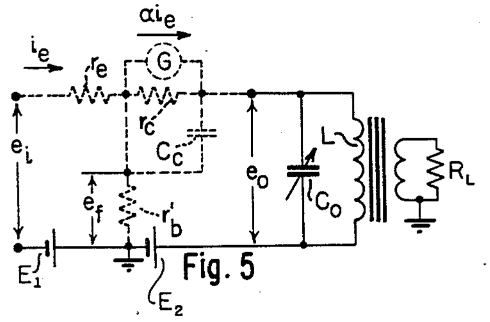
Figs. 5 and 6 are equivalent circuit diagrams illustrating a variation of internal feedback in the circuit of Fig. 1 and its correction.
Figure 6:
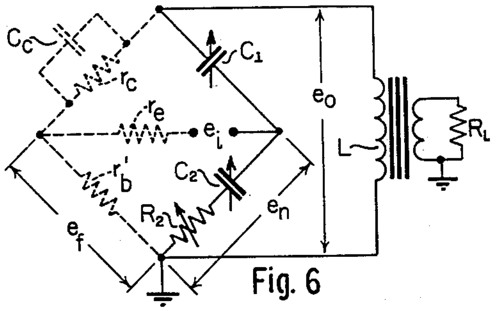

Under certain conditions, the equivalent circuit for a transistor amplifier connected like that of Fig. 1 is more accurately represented by Fig. 5. Here, in addition to the impedances $C_c$ and $r'_b$, there is shown a collector resistance $r_c$ in parallel with the active current generator G. The resistance $r_c$, by absorbing a portion of the current $\alpha i_e$, produces a negative feedback voltage which is in phase with the voltage $e_o$ in the pass band due to the fact that the current $\alpha i_e$ and the voltage $e_o$ are substantially in phase when the tank circuit is near resonance. In those circuits where this in-phase component of internal feedback, in addition to the voltage $e_f$ in quadrature therewith, is appreciable, the external feedback circuit of Fig. 6 is provided. Here, external capacitances $C_1$ and $C_2$ and a resistance $R_2$ are provided to make a balanced bridge. The neutralizing voltage $e_n$ is now seen to be the vector sum of the voltages across the resistance $R_2$ and the condenser $C_2$, the former neutralizing the component of feedback voltage in quadrature with the output voltage $e_o$ and the latter neutralizing the component in phase therewith due to the resistance $r_c$. The conditions imposed on the external parameters are readily derived by equating $e_n$ and $e_f$, assuming an applied voltage $e_o$. Reducing the equations and equating real and imaginary parts in the usual way, we find:

$$\frac{r'_b}{C_1}=\frac{R_2}{C_c} \tag{3}$$

and $$\frac{r'_b}{C_1}=\frac{r_c}{C_2} \tag{4}$$

Equations 3 and 4 are based upon the equivalent circuit as shown in Fig. 5. If this circuit is changed by assuming the connection of an added resistance between the common connection of $r_e$ and $r_c$ and the common connection of $C_c$ and $r'_b$, we then have the same circuit as that of Fig. 2 except for the addition of the resistance $r_c$. In this case, where the resistances $r_b$ and $r'_b$ are not assumed to be substantially equal, it is similarly found that the conditions for neutralization are $$\frac{r'_b}{C_1}=\frac{R_2}{C_c} \tag{5}$$

and $$\frac{r_b}{C_1}=\frac{r_c}{C_2} \tag{6}$$

where the values are such that $$r_c \gg \frac{1}{\omega C_c} \gg r'_b \tag{7}$$

a condition that can readily be obtained with practical transistors.

Figure 7:
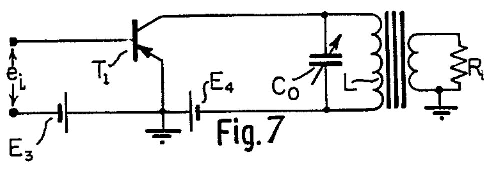
Fig. 7 is a circuit diagram of a base-input transistor amplifier of conventional form.

Fig. 7 illustrates a conventional amplifier having a p-n-p junction transistor $T_1$ connected for a base input. Batteries $E_3$ and $E_4$ provide the usual base and collector bias. An inductance L and a capacitance $C_o$ comprise a tuned tank circuit which, in the pass band, supply maximum power to an equivalent load resistance $R_L$ through a transformer coupling. Again, as in the case of the emitter input connection of Fig. 1, the observed characteristics of the circuit reveal the presence of internal feedback, producing resistance and reactance characteristics like those of Fig. 12. The observed results are expressed by the equivalent circuit of Fig. 8, wherefrom it is apparent that the output voltage $e_o$ affects the current delivered by the generator through its influence on the current $i'_b$. The value $\alpha$ is again the transfer current amplification factor of the transistor.

Figures 8, 9:
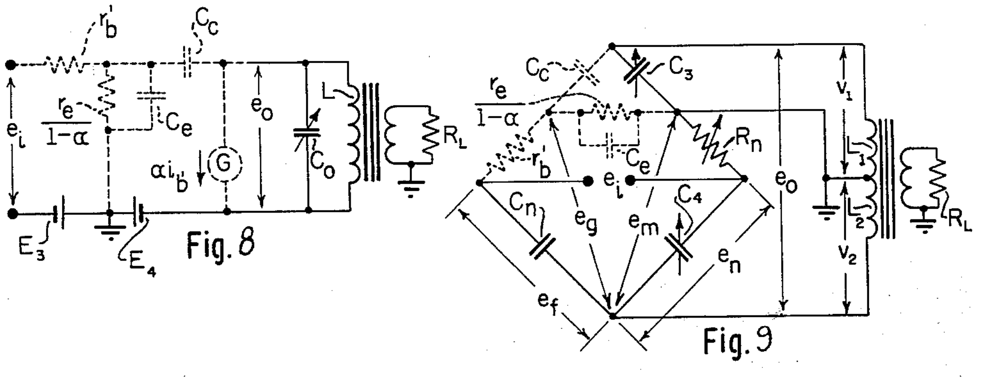
Figs. 8 and 9 are equivalent circuit diagrams illustrating internal feedback in the circuit of Fig. 7 and its correction.

To neutralize the internal feedback in the circuit of Fig. 7 there is provided the circuit of Fig. 9. Here, external impedances $C_n$, $C_3$, $C_4$ and $R_n$ are provided to make a balanced bridge. In this circuit, the inductance L is divided into parts $L_1$ and $L_2$ and the point of connection of these parts is joined with the connection between the impedances $R_n$ and $C_3$. The values of the parameters are found in the following manner: First, assuming an applied input voltage $e_o$ with the tap terminal on the inductance disconnected, no resultant voltage will exist across the terminals of the input $e_1$ if $e_n=e_f$ and $e_m=e_g$. These assumptions lead directly to the conditions $$\frac{C_c}{C_3}=\frac{C_n}{C_4}=\frac{R_n}{r'_b} \tag{8}$$

The tap terminal connection is made at such a point on the inductance that the balanced condition is undisturbed. If $$r'_b \ll \frac{1}{\omega C_c}$$

this point is determined substantially by the expression $$\left|\frac{V_1}{V_2}\right|=\frac{C_n}{C_c} \tag{9}$$

Figure 10:
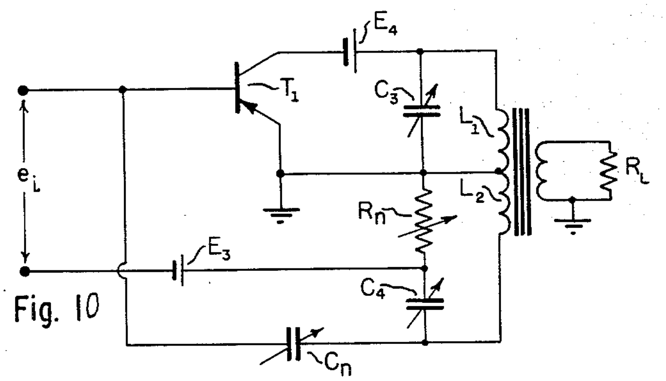
Fig. 10 is a circuit diagram of a third embodiment of the invention based on Fig. 9.

The circuit of Fig. 10 is the same as that of Fig. 9 except that the actual transistor connections are shown in place of the equivalent circuit.

It will be appreciated from the foregoing that by the external feedback connections illustrated herein, it is possible to unilateralize partially or entirely junction-type transistor amplifiers having either base or emitter input connections, thereby achieving higher gains, greater stability and selectivity, and more nearly ideal input and output impedance characteristics, especially for higher frequency applications. This permits the use of transistors in a variety of functions hitherto performed exclusively by the unilateral forms of vacuum tube circuits, notably the pentodes. Moreover, it will be further understood that, while various specific circuits and connections for neutralization and unilateralization are described herein for the purpose of illustrating the invention, such modifications of connections, circuits and adjustments of parameter values therein as would occur to one skilled in the art upon a reading of the foregoing specification are within the spirit and scope of the invention.

Having thus described the invention, I claim:

1. An amplifier circuit having, in combination, a transistor having a collector and base and emitter electrodes, a circuit connecting the collector and base electrode of the transistor including an inductance in parallel with a branch circuit, said branch circuit including capacitance and resistance elements in series, said inductance and said capacitance providing a resonant tuned circuit at frequencies in the pass band of the amplifier, output means inductively coupled with said inductance, and an input circuit connected between one of said electrodes and a point in said branch circuit between said capacitance and resistance elements, said elements in said branch circuit being arranged in combination with said input circuit to provide external inverse feedback to the transistor whereby the transistor is rendered substantially nonresponsive to its inherent internal feedback.

2. An amplifier circuit having, in combination, a transistor having a collector and base and emitter electrodes, a circuit connecting the collector and base electrode of the transistor including an inductance in parallel with a branch circuit, said branch circuit including capacitance and resistance elements in series, said inductance and said capacitance providing a resonant tuned circuit at frequencies in the pass band of the amplifier, output means responsive to the current circulating between the inductance and the branch circuit, and an input circuit connected between one of said electrodes and a point in said branch circuit between said capacitance and resistance elements, said elements in said branch circuit being arranged in combination with said input circuit to provide external inverse feedback to the transistor whereby the transistor is rendered substantially nonresponsive to its inherent feedback.

3. An amplifier circuit having, in combination, a transistor having a collector and base and emitter electrodes, a circuit connecting the collector and base electrode of the transistor including an inductance in parallel with a branch circuit, said branch circuit including, in series connection, a resistance element and a capacitance element interposed between said resistance element and the collector, said inductance and said capacitance providing a resonant tuned circuit at frequencies in the pass band of the amplifier, output means inductively coupled with said inductance, and an input circuit connected between the emitter electrode and a point in said branch circuit between said capacitance and resistance elements, said elements in said branch circuit being arranged in combination with said input circuit to provide external inverse feedback to the transistor whereby the transistor is rendered substantially non-responsive to its inherent internal feedback.

4. An amplifier circuit having, in combination, a transistor having a collector and base and emitter electrodes, a circuit connecting the collector and base electrode of the transistor including an inductance in parallel with a branch circuit, said branch circuit including capacitance and resistance elements in series, the inductance and capacitance being turned to resonate in the pass band of amplifier, output means inductively coupled with said inductance, and an input circuit between the emitter electrode and a point in said branch circuit between said capacitance and resistance elements, said elements in said branch circuit being arranged in combination with said input circuit to provide external inverse feedback to the transistor whereby the transistor is rendered substantially nonresponsive to its inherent internal feedback.

5. An amplifier circuit having, in combination, a transistor having a collector and base and emitter electrodes, a circuit connecting the collector and base electrode of the transistor including an inductance in parallel with a branch circuit, said branch circuit including first and second capacitance elements and a resistance element in series, said inductance and said capacitance providing a resonant tuned circuit at frequencies in the pass band of the amplifier, output means responsive to the current circulating between the inductance and the branch circuit, and an input circuit connected between one of said electrodes and a point in said branch circuit between said capacitance elements, said elements in said branch circuit being arranged in combination with said input circuit to provide external inverse feedback to the transistor whereby the transistor is rendered substantially nonresponsive to its inherent internal feedback.

6. An amplifier circuit having, in combination, a transistor having a collector and base and emitter electrodes, a circuit connecting the collector and base electrode of the transistor including an inductance in parallel with a branch circuit, said branch circuit including first and second capacitance elements and a resistance element in series, the inductance and combined capacitance elements being tuned to resonate in the pass band of the amplifier, output means inductively coupled with said inductance, and an input circuit connected between one of said electrodes and a point in said branch circuit between said capacitance elements, said elements in said branch circuit being arranged in combination with said input circuit to provide external inverse feedback to the transistor whereby the transistor is rendered substantially nonresponsive to its inherent internal feedback.

7. An amplifier circuit having, in combination, a transistor having a collector and base and emitter electrodes, a tapped inductance element, a first capacitance element connected between one end of the inductance element and the tap and also between the emitter electrode and collector of the transistor, a resistance element and a second capacitance element series-connected between said tap and the other end of the inductance element, a third capacitance element connected between said other end and the base electrode of the transistor, an output circuit inductively coupled with said inductance, and an input circuit connected between the base electrode and the common connection between said resistance and second capacitance elements, said resistance and capacitance element being arranged in combination with said input circuit to provide external inverse feedback to the transistor whereby the transistor is rendered substantially nonresponsive to its inherent internal feedback.

8. An amplifier circuit having, in combination, a transistor having a collector and base emitter electrodes, a tapped inductance element, a first capacitance element connected between one end of the inductance element and the tap and also between the emitter electrode and collector of the transistor, a resistance element and a second capacitance element series-connected between said tap and the other end of the inductance element, a third capacitance element connected between said other end and the base electrode of the transistor, output means responsive to the current circulating between the inductance and said first and second capacitance elements, and an input circuit connected between the base electrode and the common connection between said resistance and second capacitance elements, said resistance and capacitance elements being arranged in combination with said input circuit to provide external inverse feedback to the transistor whereby the transistor is rendered substantially nonresponsive to its inherent internal feedback.

References Cited in the file of this patent

UNITED STATES PATENTS

| | | |
|---|---|---|
| 2,663,766 | Meacham | Dec. 22, 1953 |
| 2,790,033 | Keiper | Apr. 23, 1957 |